United States Patent
Khilia et al.

(10) Patent No.: US 8,493,143 B2
(45) Date of Patent: Jul. 23, 2013

(54) PREDISTORITION LINEARIZER WITH BRIDGE TOPOLOGY HAVING AN EQUALIZER STAGE FOR EACH BRIDGE ARM

(75) Inventors: Abdel-Messiah Khilia, Backnang (DE); Detlef Leucht, Murrhardt (DE); Walter Gross, Backnang (DE); Michael Jutzi, Backnang (DE); Hartmut Schreiber, Fichtenberg (DE)

(73) Assignee: Tesat-Spacecom GmbH & Co. KG, Backnang (DE)

( * ) Notice: Subject to any disclaimer, the term of this patent is extended or adjusted under 35 U.S.C. 154(b) by 0 days.

(21) Appl. No.: 12/737,952

(22) PCT Filed: Sep. 10, 2009

(86) PCT No.: PCT/DE2009/001263
§ 371 (c)(1),
(2), (4) Date: Mar. 29, 2011

(87) PCT Pub. No.: WO2010/028635
PCT Pub. Date: Mar. 18, 2010

(65) Prior Publication Data
US 2011/0169566 A1    Jul. 14, 2011

(30) Foreign Application Priority Data
Sep. 10, 2008  (DE) .......................... 10 2008 046 689

(51) Int. Cl.
*H03F 1/26* (2006.01)

(52) U.S. Cl.
USPC .......................................... 330/149; 330/304

(58) Field of Classification Search
USPC .................. 330/149, 304; 455/114.3
See application file for complete search history.

(56) References Cited

U.S. PATENT DOCUMENTS

| | | | |
|---|---|---|---|
| 4,878,030 A | 10/1989 | Vincze | |
| 5,321,710 A * | 6/1994 | Cornish et al. | 372/26 |
| 5,428,314 A | 6/1995 | Swafford et al. | |
| 5,736,898 A | 4/1998 | Kohl et al. | |
| 6,188,279 B1 | 2/2001 | Yuen et al. | |
| 2008/0285640 A1 | 11/2008 | McCallister et al. | |

FOREIGN PATENT DOCUMENTS

| | | |
|---|---|---|
| DE | 195 28 844 | 10/1996 |
| DE | 600 06 102 | 7/2004 |
| EP | 1 098 435 | 5/2001 |
| WO | WO-00/70749 | 11/2000 |
| WO | WO-2008/144231 | 11/2008 |

* cited by examiner

*Primary Examiner* — Steven J Mottola
(74) *Attorney, Agent, or Firm* — Jordan and Hamburg LLP (57) ABSTRACT

Disclosed is a predistortion linearizer for power amplifiers using a bridge topology, which has the advantages that an equalizer stage is disposed in each of the linear and nonlinear branches. This equalizer stage is used to adjust the frequency response of the complex expansion of the bridge. The equalizers introduce variable transmission functions in the linear and nonlinear bridge branches, so that the linearizer compensates for the individual nonlinear frequency response of a power amplifier, which varies within a manufacturing lot.

15 Claims, 7 Drawing Sheets

FIG. 1

PRIOR ART

PREDISTORITION LINEARIZER WITH BRIDGE TOPOLOGY HAVING AN EQUALIZER STAGE FOR EACH BRIDGE ARM

BACKGROUND OF THE INVENTION

The invention relates to a predistortion linearizer for a power amplifier using a bridge topology.

Telecommunications payloads for spacecraft must be able to transmit large volumes of information with the lowest device mass possible. Because novel, efficient modulation methods and multi-carrier methods require increasingly large bandwidths, broadband linearizers are important components of transmission units that are transparent for carrier frequencies and a wide variety of modulation methods.

Power amplifiers exhibit nonlinear behavior, which can vary within a production lot and is highly dependent on the frequency. Linearizer bridges according to the present state of the art only allow the nonlinear compensation thereof to be adapted for a portion of the operating frequency bandwidth, but the linearization does not correspond to the required curve for the remaining frequencies within the useful band.

A linearizer bridge is based on the vectorial addition of a linear, which is to say power-independent, signal and a non-linear signal, which is to say a signal subject to distortion. The vectorial division and addition of the signals of the two branches takes place, for example, in 90° hybrids at the input or output of the circuit.

In the nonlinear branch, the signal first passes through the distortion generator. As the signal power increases, the signal deviates from the small-signal behavior at the distortion generator output with respect to amplitude and phase. In most cases, both the amplitude and phase undergo compression. Using a variable phase shifter, for example in the linear branch, or in each of the two branches, the necessary relative phase shift between the linear and nonlinear branches can be adjusted at small-signal levels.

In the nonlinear branch, or in both branches, a variable attenuator makes it possible to adjust relative attenuation between the nonlinear and linear branches.

At frequencies in the double-digit GHz range, the nonlinear behavior of amplifiers is highly dependent on the frequency. Parasitic effects within the linearizer bridge make it more difficult to control the frequency response of the linearizer. In general, the desired properties can only be adjusted in a limited frequency range.

DE 195 28 844 C1 describes a "method and a system for linearizing the gain characteristics and phase-frequency characteristics of traveling-wave tubes and transistor amplifiers at different power levels". To this end, the signal is divided into two branches and again united into an output signal, wherein the signal is divided between two nonlinear partial networks having compressing gain characteristics, and gain compression or gain expansion of the partial signals is generated at two gates by reflection behavior, which differs depending on the signal level. The nonlinear, gain-expanded signal and the gain-compressed signal are united into the output signal using an adding network.

A "broadcast transmission system with distributed correction" (DE 600 06 102 T2) is known for compensating for distortions in a digital transmission system. To this end, a transmission system is provided with a signal path, wherein a first component of a plurality of components, which are located in the signal path, subject the information signal to nonlinear distortion shifts, and a further plurality of components, which are third and fourth components, are used to modify the information signal so as to compensate for distortions in inverse order to the first plurality of components. The first component comprises an amplifier, the second component comprises a predistortion filter, the third component comprises a nonlinear corrector, and the fourth component comprises a linear equalizer. The fifth component comprises a filter and the sixth a second linear equalizer.

SUMMARY OF THE INVENTION

In contrast, the invention has the advantage that an equalizer stage is disposed in each of the linear and nonlinear bridge branches. This equalizer stage is used to adjust the frequency response of the complex expansion of the bridge. The equalizer stages in the linear and nonlinear bridge branches introduce a precisely defined amplitude and phase response, which compensates for parasitic effects, for example due to stray capacitances and bond inductances, and results in the desired broadband expansion with respect to the amplitude and phase at the output of the linearizer circuit.

The equalizers introduce variable transmission functions into the linear and nonlinear bridge branches, so that the linearizer compensates for the individual nonlinear frequency response of an amplifier that varies within a manufacturing lot. For example, it is possible to adjust the phase expansion so as to increase over the frequency, while the amplitude expansion remains constant. Likewise, it is also possible to achieve amplitude expansion that increases over the frequency, while phase compression increases at the same time. The equalizer stage thus allows the bridge to be precisely adjusted to the characteristics of the amplifier.

According to an advantageous embodiment of the invention, the equalizer stage can be implemented both as a passive circuit and as a variable circuit using active elements, such as diodes and transistors.

The equalizer block in this embodiment according to the invention is decisive for implementing large useful bandwidths, which are desirable for cost reasons and, in the space industry, for weight and redundancy reasons.

Further advantages and advantageous embodiments of the invention will be apparent from the following description, the drawings, and the claims.

DESCRIPTION OF THE PREFERRED EMBODIMENTS

Figure 1:
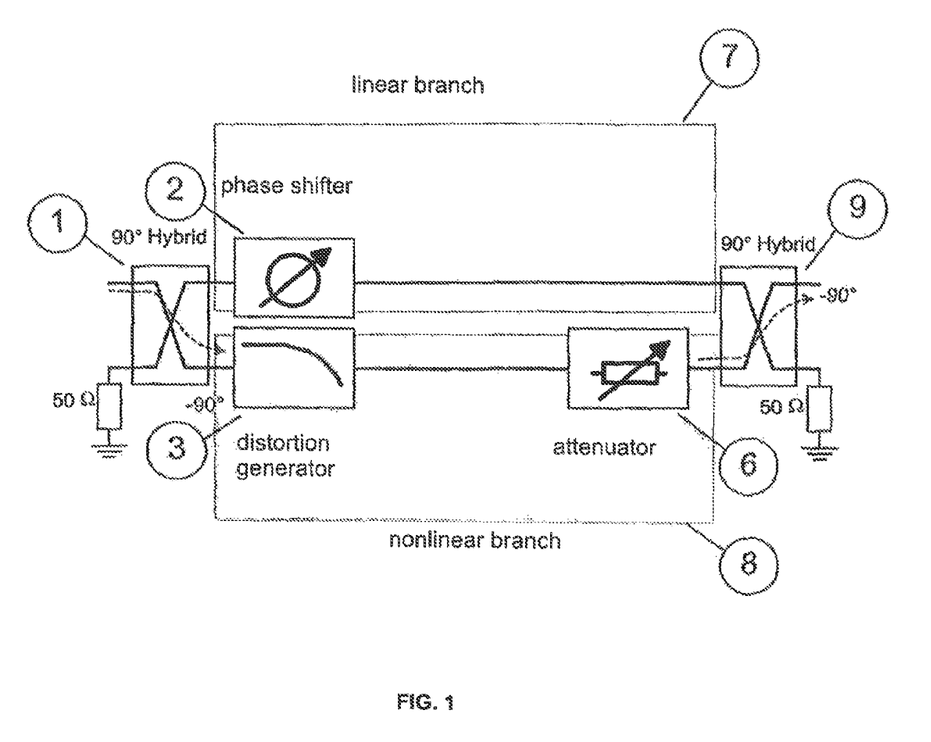
FIG. 1 shows a block diagram of the linearizer bridge according to the prior art.

FIG. 1 shows a block diagram of the linearizer bridge according to the prior art, comprising the 90° hybrid 1 at the input, the phase shifter 2, and the 90° hybrid 9 at the output of the circuit. The vectorial addition of the linear, this being the power-dependent, signal, takes place here. In addition, a distortion generator 3 and an attenuator 6 are interconnected in the nonlinear signal, this being the signal subject to distortion.

In the nonlinear branch, the signal first passes through the distortion generator 3. As the signal power increases, the signal deviates from the small-signal behavior at the distortion generator output with respect to amplitude and phase. In most cases, the amplitude undergoes compression, which is indicated in FIG. 1. Using a variable phase shifter 2 in the linear branch, the necessary propagation time difference between the two branches can be achieved at small-signal levels.

In the nonlinear branch, a variable attenuator 6 allows the relative attenuation between the nonlinear and linear branches to be adjusted using a control current.

Figure 2:
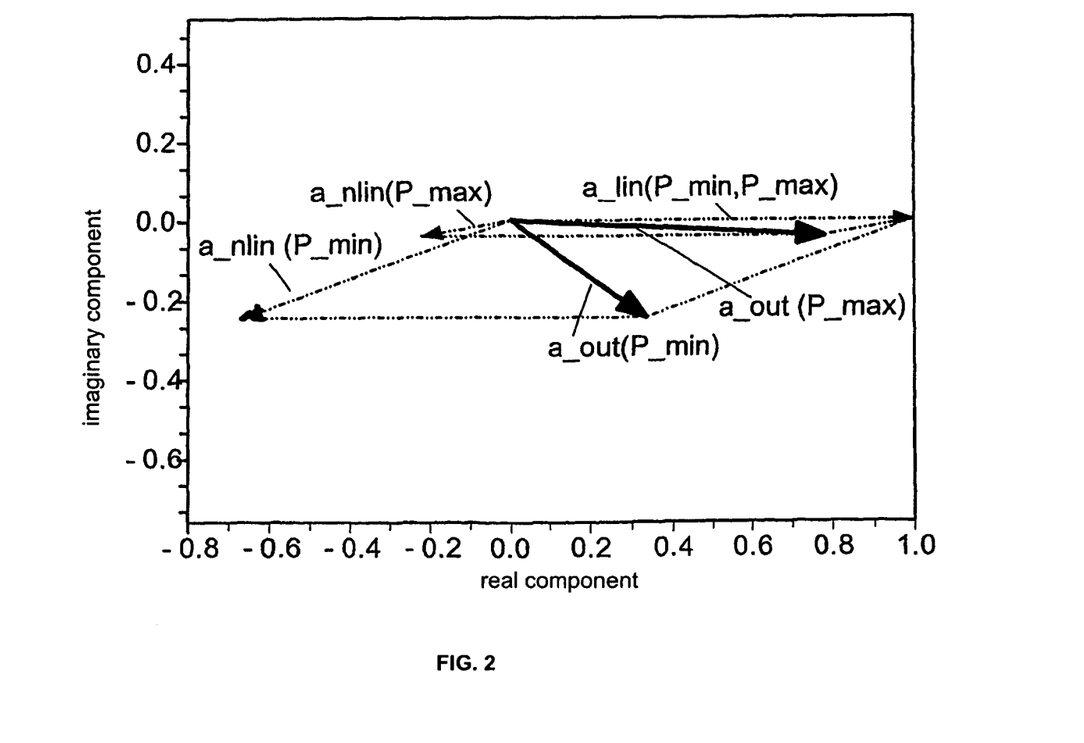
FIG. 2 shows the addition of the signal vectors according to the prior art.

FIG. 2 illustrates the addition of the signal vectors from the linear and nonlinear branches. a_out denotes the output signal. The illustration standardizes the magnitudes to the signal in the linear branch. Compared to the signal in the linear branch, in this embodiment, the magnitude of the signal in the nonlinear branch decreases as the input power increases, and the phase rotates clockwise, which is to say the nonlinear element causes a compression of the amplitude and phase. As a result, the magnitude and phase of the linearizer output signal increases as compared to the small signal operation.

Figure 3:
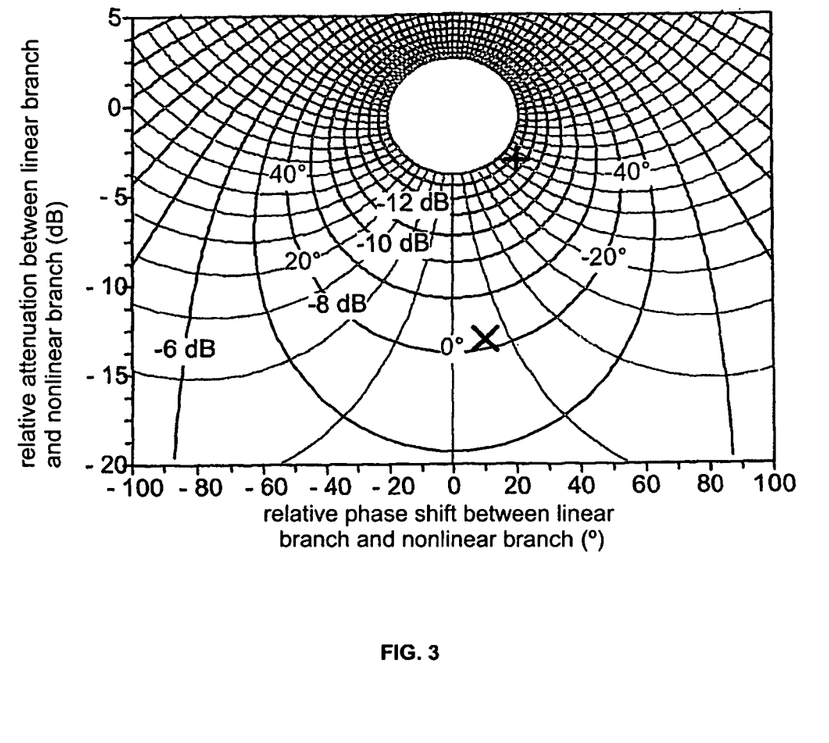
FIG. 3 shows the isocontour curves of the transmission function according to magnitude and phase, according to the prior art.

FIG. 3 shows the isocontour curves of the insertion loss and of the phase shift of the linearizer output signal according to magnitude and phase. The end points for the minimum and maximum input powers are marked by crosses. The + corresponds to the operation with minimal input power and the X marks the operation with maximum input power.

Figure 4:
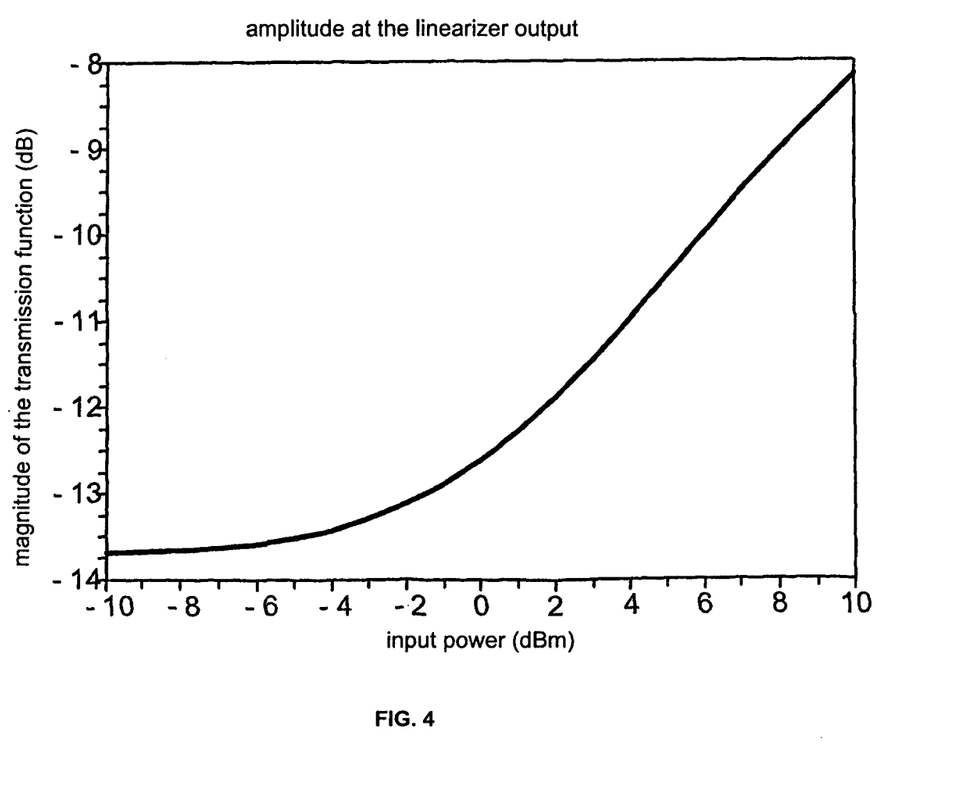
FIG. 4 shows the magnitude of the transmission function of the linearizer as a function of the input power, according to the prior art.
Figure 5:
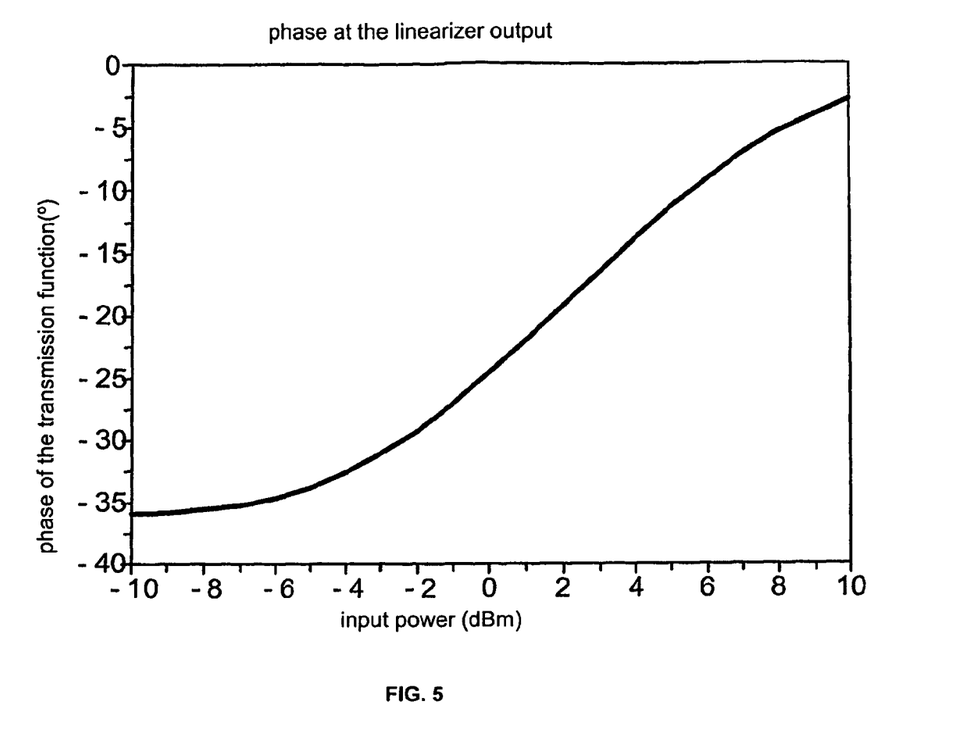
FIG. 5 shows the phase of the transmission function of the linearizer as a function of the input power, according to the prior art.

FIG. 3 shows that the isocontour field is passed through as the power varies, so that the expansion curves according to magnitude and phase shown in FIGS. 4 and 5 are obtained. In FIG. 4, the magnitude of the transmission function of the linearizer is shown as a function of the input power.

FIG. 5 shows the phase of the transmission function of the linearizer as a function of the input power.

Figure 6:
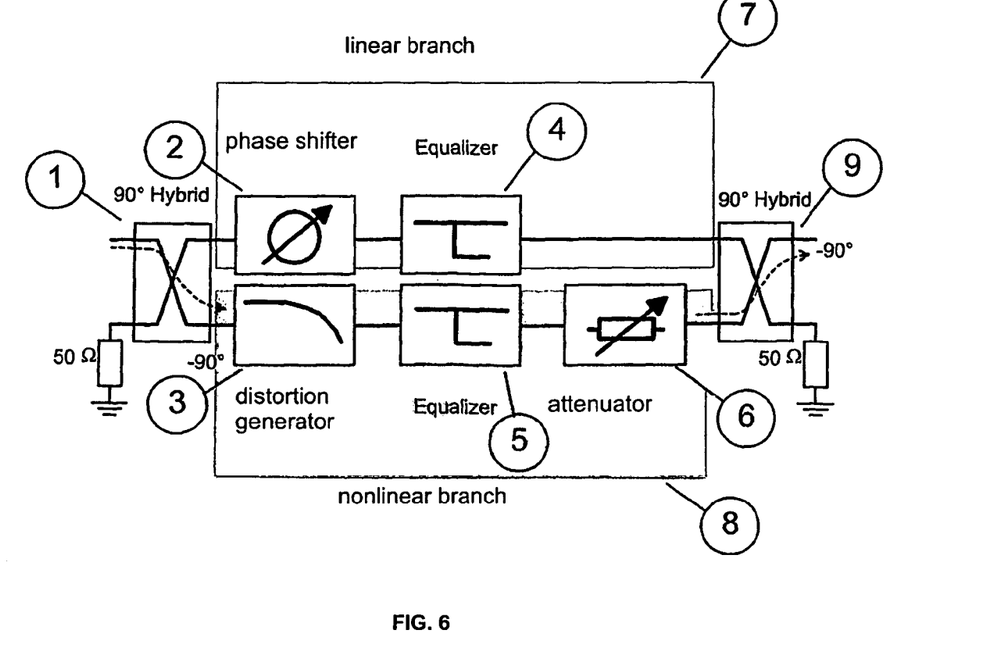
FIG. 6 shows a block diagram of the linearizer bridge according to the invention.

FIG. 6 shows the block diagram of the linearizer bridge according to the claimed embodiment, comprising an additional equalizer stage in each of the linear and nonlinear branches. This equalizer stage is critically important for adjusting the linearizer bridge. Both in the linear and in the nonlinear branch, an equalizer 4, 5 inserts a frequency response with respect to the amplitude and phase. In this way, complex transmission functions can be achieved in the two bridge branches, which lead to the desired expansion with respect to the amplitude and phase at the output of the linearizer circuit, and parasitic effects are deliberately compensated for, such as those due to stray capacitances and bond inductances.

Figure 7:
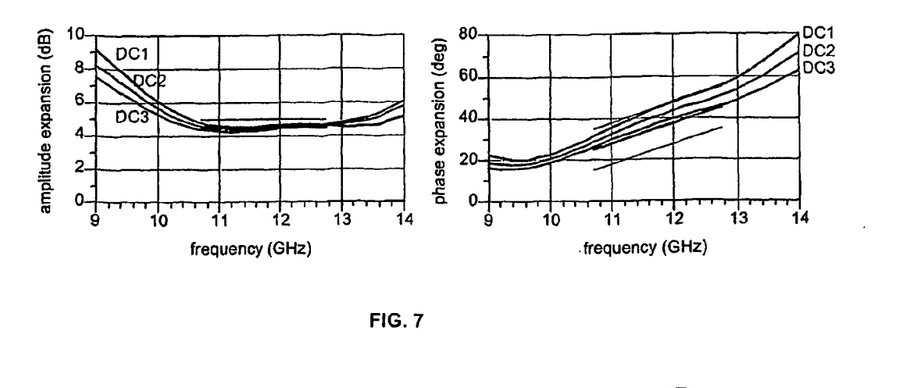
FIG. 7 shows the frequency response of the amplitude and phase expansions of the linearizer bridge for the maximum input power.

FIG. 7 shows the frequency response of the amplitude and phase expansions of the linearizer bridge for the maximum input power in the GHz range. Amplifiers have frequency-dependent compression characteristics. The required expansion characteristic of a typical Ku-band TWT is identified by way of example with straight lines, including the tolerance range, in the band from 10.7 to 12.7 GHz.

Figure 8:
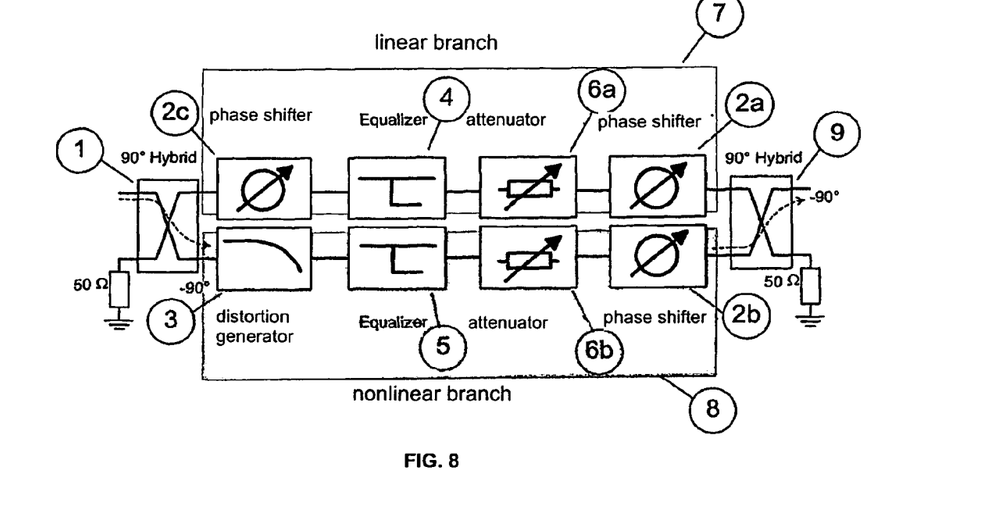
FIG. 8 shows a block diagram of the linearizer bridge according to the invention with a symmetrical design.

The equalizer 4, 5 introduces a variable frequency response into the transmission behavior of the linear and nonlinear branches, so that the linearizer, for example, exhibits a constant amplitude expansion and phase expansion that increases over the frequency, as is shown in FIG. 7. The equalizer 4, 5 thus allows the bridge to be precisely adjusted to the characteristics of the amplifier. The equalizer 4, 5 can be implemented both as a passive circuit and as a variable circuit using active elements, such as diodes and transistors FIG. 8 shows a further embodiment of the invention, which has a substantially symmetrical design both in the linear and nonlinear branch. In the linear branch, a phase shifter 2c is provided, which compensates for the propagation time through the distortion generator 3. One attenuator 6a, 6b and one phase shifter 2a, 2b in each of the linear and nonlinear branches form a differential phase shifter or a differential attenuator. Because of the symmetrical design, the signal undergoes similar propagation time delays.

All characteristics provided in the description, the following claims, and the drawings can be essential for the invention, both individually, or in any arbitrary combination with each other.

LIST OF REFERENCE NUMERALS 1 90° hybrid
2 Phase shifter
2a Phase shifter a, symmetrical embodiment
2b Phase shifter b, symmetrical embodiment
2c Phase shifter c, symmetrical embodiment
3 Distortion generator
4 First equalizer
5 Second equalizer
6 Attenuator
6a Attenuator a, symmetrical embodiment
6b Attenuator b, symmetrical embodiment
7 Linear branch
8 Nonlinear branch
9 90° hybrid

The invention claimed is:

1. A method for adjusting a predistortion linearizer in bridge topology for linearizing broadband amplifiers, the linearizer comprising a phase shifter in a linear branch and a distortion generator and an attenuator in a nonlinear branch, the linearizer further comprising an equalizer stage each in the linear and nonlinear branches, the method comprising:
introducing a frequency response with respect to amplitude and phase into the linear and nonlinear branches by means of the equalizer stage in each of the linear and nonlinear branches.

2. A method according to claim 1, wherein the linearize bridge is adjusted to the characteristics of the amplifier using the method.

3. A method according to claim 1, wherein the method is carried out by means of a passive circuit.

4. A method according to claim 1, wherein the method is carried out variably by means of active elements such as diodes and/or transistors.

5. A predistortion linearizer in bridge topology for linearizing broadband amplifiers, the linearizer having a linear branch and a nonlinear branch, the linearizer comprising:
a phase shifter and a first equalizer stage in the linear branch; and
a distortion generator, an attenuator and a second equalizer stage in the nonlinear branch.

6. The device according to claim 5, wherein the first and second equalizer stages are used to adjust the linearizer bridge.

7. The device according to claim 5, wherein frequency responses caused by parasitic effects can be compensated for.

8. The device according to claim 7, wherein the parasitic effects are due to the frequency-dependent behavior of all bridge components such as the distortion generator, phase shifter and attenuator.

9. The device according to claim 5, wherein the first and second equalizer stages cause amplitude expansion that is constant, decreases or increases over the frequency, and/or phase expansion that decreases or increases.

10. The device according to claim 6, wherein the first and second equalizer stages are designed to be variable using active elements, such as diodes or transistors.

11. The device according to claim 5, wherein the first and second equalizer stages introduce a variable frequency response into each of the linear and the nonlinear branches.

12. The device according to claim 11, wherein the first and second equalizer stages introduce a complex, frequency-dependent linear transmission function into each of the linear and the nonlinear branches.

13. The device according to claim 8, wherein parasitic effects caused by stray capacitances and bond inductances can be compensated for.

14. The device according to claim 9, wherein the first and second equalizer stages allow the frequency response types of the amplitude and phase expansions to be combined as required for the linearization.

15. A device according to any claim 1, wherein the first and second equalizer stages are designed to be variable using active elements, such as diodes or transistors.

* * * * *